United States Patent [19]

Little

[11] Patent Number: 5,144,250
[45] Date of Patent: Sep. 1, 1992

[54] POWER AMPLIFIER TIME DOMAIN REFLECTOMETER

[75] Inventor: Brian W. Little, Marion, Iowa

[73] Assignee: Rockwell International Corporation

[21] Appl. No.: 589,876

[22] Filed: Sep. 27, 1990

[51] Int. Cl.⁵ .................... G01R 31/11; G01R 27/04
[52] U.S. Cl. .................................. 324/533; 324/642
[58] Field of Search .............. 324/527, 532, 533, 534, 324/535, 642, 644; 379/26

[56] References Cited

U.S. PATENT DOCUMENTS

| | | | |
|---|---|---|---|
| 3,020,529 | 2/1962 | Turner | 324/642 |
| 3,355,663 | 11/1967 | Aronoff | 324/642 |
| 3,704,410 | 11/1972 | O'Brien | 324/642 |
| 4,104,582 | 8/1978 | Lambertsen | 324/533 |
| 4,241,305 | 12/1988 | Dickerson | 324/532 |
| 4,316,139 | 2/1982 | Root | 324/535 |
| 4,475,679 | 10/1984 | Gale | 324/642 |
| 4,797,621 | 1/1989 | Anderson et al. | 324/533 |
| 4,949,076 | 8/1990 | Wann | 324/533 |
| 4,967,159 | 10/1980 | Manes | 324/642 |

FOREIGN PATENT DOCUMENTS

| | | | |
|---|---|---|---|
| 702321 | 12/1979 | U.S.S.R. | 324/533 |
| 886268 | 11/1981 | U.S.S.R. | 324/533 |

OTHER PUBLICATIONS

T. Szeredi IBM Technical Disclosure vol. 21, No. 9 Feb., 1979 Testing Telecommunications Codes for Damage.

Primary Examiner—Kenneth A. Wieder
Assistant Examiner—Maura K. Regan

[57] ABSTRACT

A system component in an RF power amplifier output circuit which has suffered an impedance failure, including antenna, antenna interface system component and interconnecting cables, is identified by the present invention. The RF signal from the power amplifier is outputted to the system components system components in question. A bidirectional coupler detects the voltage wavefront of the outgoing power amplifier output signal and the voltage wavefront of the reflected RF signal caused by an impedance fault. The beginning of a forward voltage wavefront is used to trigger a timing device which continues timing until the beginning of the reflected voltage wavefront is detected. The RF signal is used as the time base for the timing device. The time between the beginning of the forward and reflected voltage wavefronts is therefore a measure of the distance between the voltage detection point and the impedance failure. If the distance and signal velocity characteristics of the system components being tested are known, then the time indicated by the timing device is indicative of the failed system component. The failed system component can be identified by storing an array of times and associated system component identification parameters in a memory device and comparing the measured delay to the stored times.

14 Claims, 1 Drawing Sheet

POWER AMPLIFIER TIME DOMAIN REFLECTOMETER

BACKGROUND OF THE INVENTION

The invention relates to new and useful improvements in power amplifiers, and particularly to power amplifiers having self-diagnosing impedance fault determination.

Radio frequency (RF) transmission devices are subject to impedance failures which can cause a high voltage-standing wave ratio (VSWR). Impedance failures not only interrupt the desired communication activity but the rsulting high VSWR can also lead to damage to system components from high reflected RF voltages. Locating such faults can be a time-consuming and difficult process, especially in such cramped and intense environments as airborne communications systems. In such environments quickly locating and correcting system faults is not only a matter of convenience and cost, but it can also make the difference between the success and failure of a mission or flight.

In currently available RF devices in the higher ranges (e.g. 1 GHz), it is possible to determine from an increased VSWR that a system component failure has occurred, but it is not possible to easily determine which component has failed. Time domain reflectometers are known, but they are very expensive and too large for frequencies in the Gigahertz ranges. This means that each possible failed component must be checked or replaced. If it were possible to determine which component has failed, then only that component could be replaced, thereby saving a large amount of time and perhaps preserving a vitally important mission. In addition, costly and weighty external test equipment would not be needed.

It is therefore an object of the present invention to provide an RF device in which impedance failures are quicker and easier to detect than in currently available devices.

It is another object of the present invention to provide an RF device which can determine in which of several system components a impedance failure has occurred.

It is a further object of the present invention to provide a time domain reflectometer for use in the Gigahertz frequency range.

Still other objects will become apparent in the following summary and description of a preferred embodiment of the invention.

SUMMARY OF THE INVENTION

A system component in an RF power circuit which has suffered an impedance failure is identified by the present invention. An RF signal is conducted on an output line to the system components which are to be tested for an impedance failure. A bidirectional coupler detects the wavefront of the output RF signal and the wavefront of the reflected RF signal caused by a an impedance fault. The beginning of the output signal wavefront is used to trigger a timing device which continues timing until the beginning of the reflected signal wavefront is detected. A portion of the RF signal is coupled from the output line to serve as a clock signal for the counter. The time between the beginning of the output and reflected signal wavefronts is therefore a measure of the distance between the signal detection point and the impedance failure. If the distance and signal velocity characteristics of the system components being tested are known, then the time indicated by the timing device is indicative of the failed system component. The failed system component can be identified by storing an array of times and associated system component identification parameters in a memory device as a function of frequency and comparing the measured delay for the appropriate frequency to the stored times.

BRIEF DESCRIPTION OF THE DRAWINGS

The invention may be more fully understood by reading the following description of a preferred embodiment of the invention in conjunction with the appended drawings wherein.

DETAILED DESCRIPTION OF A PREFERRED EMBODIMENT

Figure 1:
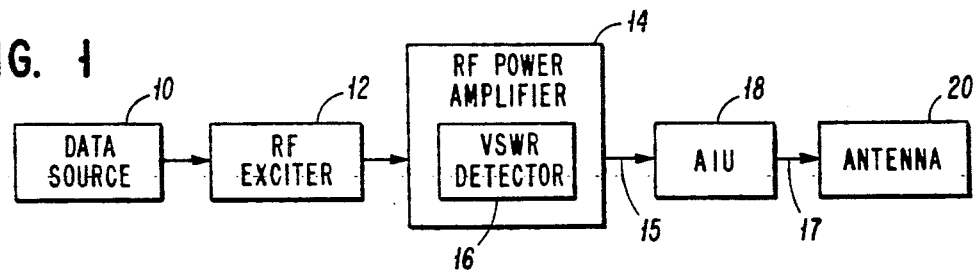
FIG. 1 is a block diagram of a radio frequency transmission system in which the present invention may be embodied.

The invention may be embodied in a radio frequency transmission system as shown in FIG. 1. A baseband frequency data signal from a data source 10 is coupled to an RF exciter 12 which produces a modulated RF signal embodying the data signal. Neither the type of data signal or modulation technique is important to the invention. The modulated RF signal produced by RF exciter 12 is coupled to an RF amplifier 14 in which is embodied a VSWR detector in accordance with the present invention. Power amplifier 14 amplifies the RF signal to a suitable level and supplies it via cable 15 to an antenna interface unit 18 (AIU). AIU 18 typically serves as a transmit-receive switch, but it can also include any one of numerous other functions, including filtering, impedance matching, and noise figure setting. The RF signal is then fed from AIU 18 to an antenna 20 via a cable 17.

Figure 2:
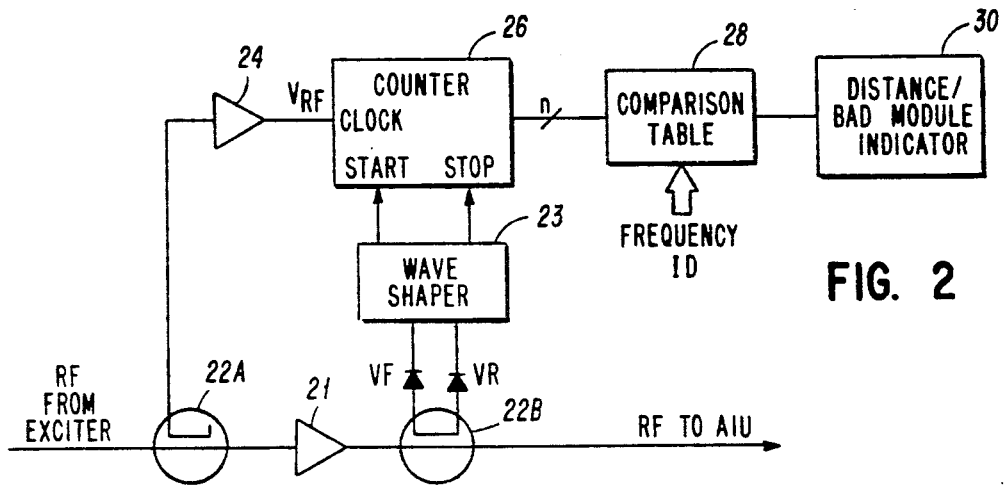
FIG. 2 is a more detailed block diagram of the power amplifier of FIG. 1 in accordance with the present invention.

A more detailed depiction of the power amplifier 14 is shown in FIG. 2. The power amplifier comprises an amplifier module 21 and other circuitry comprising VSWR detector 16. A dual RF directional coupler comprising sections 22A and 22B sample the RF signal on the input and output sides of amplifier module 21. Directional coupler section 22A couples the unamplified RF signal $V_{RF}$ produced by RF exciter 12 to the CLOCK input of a counter 26. An amplifier 24 amplifies the $V_{RF}$ signal to a level sufficient to drive counter 26. Directional coupler section 22B samples both the forward RF voltage $V_F$ produced by amplifier module 20 and the reverse RF voltage $V_R$ caused by a fault in AIU 18, antenna 20, cable 15, or cable 17. The forward voltage $V_F$ are both coupled to a wave shaper 23. Wave shaper 23 adjusts the shape of the forward and reverse voltage waveforms such that the timing relationship between the two waveforms is the same. For example, the reflected voltage waveform is typically lower in amplitude than the forward voltage waveform due to transmission losses. Thus, the half power point occurs at a relatively different time in the forward voltage waveform that in the reflected voltage waveform. Wave shaper 23 can amplify the reflected waveform to have the same amplitude as the reflected waveform to preserve timing relationships. Wave shaper 23 may also accomplish the same goals in other ways known in the art. Wave shaper 23 then triggers at the same time-relative point on both the forward and reflected waveforms and outputs pulses to counter 26 to start and stop its operation. The trigger signal from wave shaper 23 to the START input of counter 26 is based upon the forward voltage waveform $V_F$, and the trigger signal from wave shaper 23 to the STOP input of counter 26 is based upon the reflected voltage waveform $V_R$.

The output of counter 26 is coupled via a line n bits wide to a comparison table which may comprise a memory containing an array of delay times and associated system component identification parameters. Since delay counts and thus distances are dependent upon the frequency of the RF signal, the delay times may be stored with frequency as another variable. A FREQUENCY ID signal indicative of the frequency of the RF signal is coupled to comparison table for use as an index to the array. The output from comparison table 28 is coupled to a distance/bad module indicator 30. Indicator 30 may comprise any input/output device such as indicator lights or a video display.

In operation, the forward voltage surge provided by the RF signal from RF exciter 12 is detected by directional coupler section 22B as voltage $V_F$ and wave shaper 23 processes the waveform and triggers causes counter 26 to begin counting the cycles of the RF signal $V_F$. If an impedance fault occurs in AIU 18, antenna 20, or in the interconnecting cables 15 and 17, the resulting reverse voltage $V_R$ is detected by directional coupler section 22B. Wave shaper 23 processes the waveform to achieve the timing relationship with the $V_F$ waveform and triggers and counter 26 to stop counting at the same relative time on the $V_R$ waveform as counter 26 was triggered "on" on the $V_F$ waveform. The count in counter 26 is coupled to comparison table 28, which uses the delay time and signal frequency to look up the distance to the impedance fault and the identity of the module in which the fault occured. This information is outputted to an indicator 30 for display.

Figure 3:
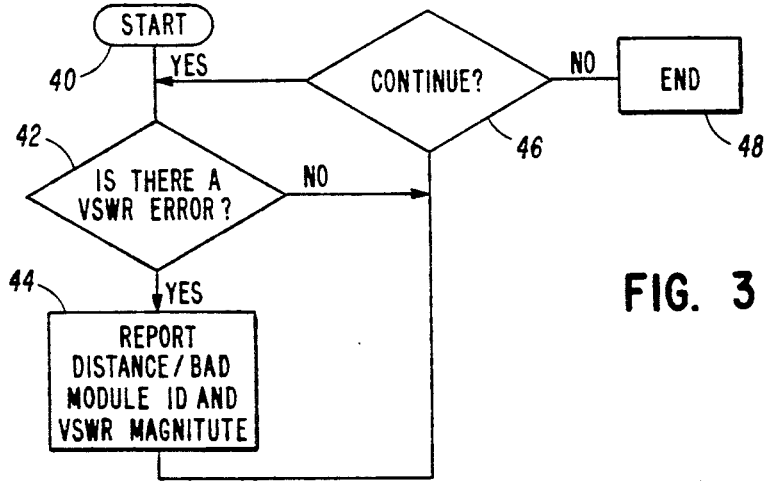
FIG. 3 is a flow chart associated with the logical operation of the present invention.

FIG. 3 is a flow chart of the logic of the present invention. Operation begins with start module 40 and proceeds to module 42 where a decision is made as to the existence of a VSWR error (impedance fault). If no VSWR error is found, the logic flows loops back to the input of module 42 and continues until a VSWR error is found. When an error is found, the operation flows to module 44 which reports the distance, the bad module ID, and the magnitude of the VSWR. The program flow then proceeds to decision module 46 where a decision to continue or stop processing is made. If a decision to continue is made, then the logic flow returns to the input of module 46. Otherwise, operation ends in module 48.

Figure 4A:
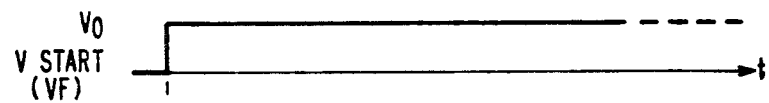
FIGS. 4(a)-4(c) are timing charts associated with the operation of the present invention.
Figure 4B:
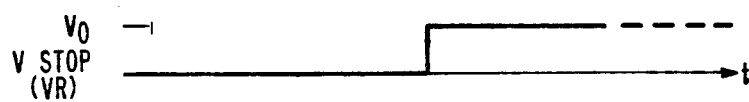
Figure 4C:
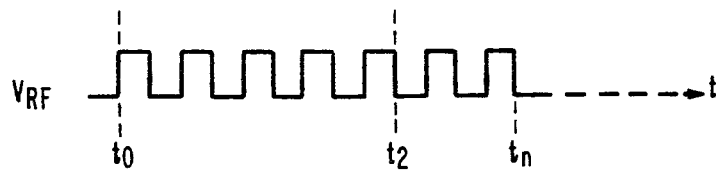

The waveforms associated with operation of the invention are shown in FIGS. 4(a)--(c). FIG. 4(c) shows the RF output of power amplifier starting at time $t_o$ an continuing to some time $t_n$. At time to the level of $V_{START}$ ($V_F$) rises from 0 to some level $V_O$, which causes counter 26 to begin incrementing. At some later time $t_2$ a reverse voltage caused by an impedance failure causes $V_{STOP}$ ($V_R$) to rise to level $V_O$, which stops the incrementing in counter 26.

Since RF signals travel in various media at different but known constant velocities, the count in counter 26 is a measure of the distance between directional coupler 22B and the location of the fault. If we assume that the cable 15 is 6 inches long, that cable 10 is 10 feet long, then the following typical delays between detection of the forward and reverse voltages would occur if a impedance failure occurs in the indicated system component:

TABLE 1

| Impedance failure Location | Delay - Forward Plus Reverse (nsec) |
| --- | --- |
| Power amplifier 14 or input of cable 15 | 0.00 |
| Output of cable 15 or input of AIU 18 | 1.62 |
| Output of AIU 18 or input of cable 17 | 23.60 |
| Output of cable 17 or antenna 20 | 56.00 |

The foregoing results are not frequency dependent since signal velocities are relatively constant above the VHF range. Thus, using the delay information, a" impedance failure can be narrowed to either a module or one of the interconnecting cables. While particular embodiments of the present invention have been shown and described, it should be clear that changes and modifications may be made to such embodiments without departing from the true scope and spirit of the invention. It is intended that the appended claims to cover all such changes and modifications.

I claim:

1. Apparatus integral with an RF data transmission system for determining during data transmission the identity of a system component in said system suffering from an impedance failure, comprising:
    means for generating an RF signal;
    means for modulating the RF signal with data;
    first means operative during data transmission for detecting an aspect of the forward component of said RF signal;
    second means operative during data transmission for detecting the same aspect of the reverse component of said RF signal;
    means operative during data transmission, referenced to said RF signal for timing the delay between detection of the aspect of the forward component of said RF signal and the aspect of the reverse component of said RF signal; and
    means responsive to the time delay for identifying the system component in which said impedance failure occured.

2. Apparatus for determining the identity of a system component as described in claim 1 wherein said aspect of the forward component of said signal used by said first detecting means is the wavefront of said RF signal and said aspect of said reflected component of said RF signal used by said second detecting means is the wavefront of said reflected RF signal.

3. Apparatus for determining the identity of a system component as described in claim 2 wherein said first and second detecting means comprise a single bidirectional RF coupler.

4. Apparatus for determining the identity of a system component as described in claim 2 wherein said first and second detecting means each comprises an RF coupler.

5. Apparatus for determining the identity of a system component as described in claim 3 wherein said timing means comprise a counter.

6. Apparatus for determining the identity of a system component as described in claim 5 further including means for deriving the clock signal for said counter from, said RF signal.

7. Apparatus for determining the identity of a system component as described in claim 1 wherein said identifying means comprises:
   a memory holding an array of delay times and system component identifications associated with each delay times; and
   means for comparing the delay measured by said timing means to delay times stored in said array to determine the identity of the system component suffering impedance failure.

8. Apparatus for determining the identity of a system component as described in claim 7 further including means for indicating the system component suffering impedance failure.

9. Apparatus for determining the identity of a system component as described in claim 8 further including means for correlating said delay time to the frequency of the RF signal.

10. Apparatus integral with an RF data transmission system for determining the identity of a system component in said system suffering from an impedance failure, comprising:
    means for generating a data carrying RF signal;
    a first RF coupler operative during data transmission for detecting the wavefront of the RF signal in the forward direction;
    a second RF coupler operative during data transmission for detecting the wavefront of the reflected RF signal associated with impedance failure in the reverse direction;
    a counter for timing the delay between detection of the forward RF signal wavefront and the reverse RF signal wavefront;
    means operative during data transmission for deriving the clock signal for the counter from said RF signal;
    a memory holding an array of delay times and system component identifications associated with each delay time;
    means for comparing the delay measured by said timing means to delay times stored in said array to determine the identity of the system component suffering impedance failure; and
    means responsive to the time delay for identifying the system component in which said impedance failure occured.

11. Apparatus for determining the identity of a system component as described in claim 10 wherein said first and second Rf couplers comprise a single bidirectional RF coupler.

12. Method of determining the identity of a system component in an RF data transmission system suffering from an impedance failure, said method being operative during data transmission, comprising the steps of:
    generating a data carrying RF signal;
    detecting the incidence of the data carrying RF signal in a first direction;
    detecting the incidence of the reflected version of said data carrying RF signal in a second direction;
    deriving a time reference from said data carrying RF signal;
    timing the difference between the incidence of said data carrying RF signal in the first direction and the incidence of said data carrying RF signal in the second direction using the time reference;
    calculating the distance travelled by said data carrying RF signal between the first and second incidences of said RF signal; and
    identifying the failed system component from the calculated distance.

13. Method of determining the identity of a system component as described in claim 12 wherein further including the step of deriving the time base for the timing step from said RF signal.

14. An RF transmission system with integral impedance fault location capability operative during data transmission, comprising:
    means for generating an RF carrier signal;
    a data source;
    means responsive to the data source for modulating the RF signal;
    first means for detecting an aspect of the forward component of said RF carrier signal while data is being transmitted;
    second means for detecting the same aspect of the reverse component of said modulated RF carrier signal resulting from an impedance fault in said data transmission system while data is being transmitted;
    means referenced to said RF carrier signal for timing the delay between detection of the aspect of the forward component of said modulated RF signal and detection of the aspect of the reverse component of said RF signal; and
    mean responsive to the time delay for identifying the location of said impedance failure.

* * * * *